(12) United States Patent
Stelzl et al.

(10) Patent No.: US 6,685,168 B1
(45) Date of Patent: Feb. 3, 2004

(54) SURFACE ACOUSTIC WAVE COMPONENT

(75) Inventors: Alois Stelzl, Munich (DE); Hans Krüger, Munich (DE); Karl Weidner, Munich (DE); Manfred Wossler, Munich (DE)

(73) Assignee: Epcos Aktiengesellschaft, Münich (DE)

( * ) Notice: Subject to any disclaimer, the term of this patent is extended or adjusted under 35 U.S.C. 154(b) by 0 days.

(21) Appl. No.: 09/622,139

(22) PCT Filed: Feb. 16, 1999

(86) PCT No.: PCT/DE99/00420

§ 371 (c)(1),
(2), (4) Date: Dec. 22, 2000

(87) PCT Pub. No.: WO99/41833

PCT Pub. Date: Aug. 19, 1999

(30) Foreign Application Priority Data

Feb. 17, 1998 (DE) .......................... 198 06 550

(51) Int. Cl.[7] .............................................. H01L 23/48
(52) U.S. Cl. ................... 251/778; 310/313 R; 29/25.35
(58) Field of Search ................ 310/344, 363, 310/364, 313 R, 340; 29/25.01; 257/778

(56) References Cited

U.S. PATENT DOCUMENTS 4,710,798 A * 12/1987 Marcantonio ................ 357/80
5,102,829 A * 4/1992 Cohn .......................... 437/217
5,821,604 A * 10/1998 Egawa ........................ 257/659
5,821,665 A * 10/1998 Onishi et al. ........... 310/313 R
5,872,331 A    2/1999 Ando et al.
6,057,222 A    5/2000 Pahl et al.

FOREIGN PATENT DOCUMENTS

| CA | 2241083 | 7/1997 |
| CA | 2241100 | 7/1997 |
| CA | 2241132 | 7/1997 |
| DE | 195 48 050 | 6/1997 |
| DE | 195 48 046 | 1/1998 |
| EP | 0 868 778 | 10/1998 |

* cited by examiner

*Primary Examiner*—Douglas A. Wille
(74) *Attorney, Agent, or Firm*—Schiff Hardin & Waite

(57) ABSTRACT

An electronic component such as a surface acoustic wave component has a chip a piezoelectric substrate with electrically conductive structures thereon and a base plate having external electrical terminal elements that are contacted to the electrically conductive structures of the chip. A protective film is applied onto the chip surface carrying the electrically conductive structures. The surface of the protective film facing away from the piezoelectric substrate carries electrical contact elements that are connected, to the electrically conductive structures of the chip via through-contacts in the protective film and/or directly via bumps, as well as to the electrical terminal elements of the base plate.

7 Claims, 1 Drawing Sheet

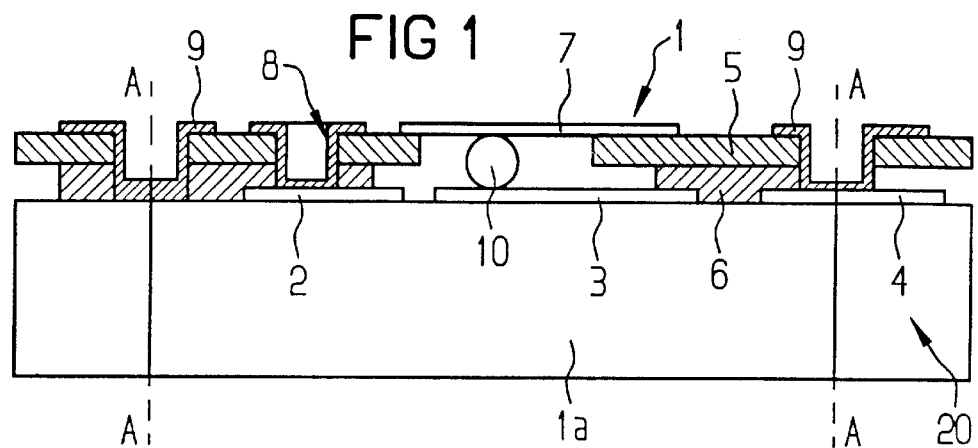
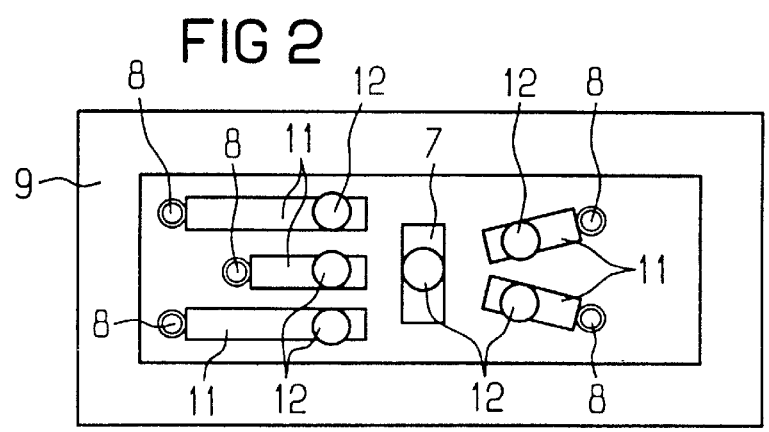
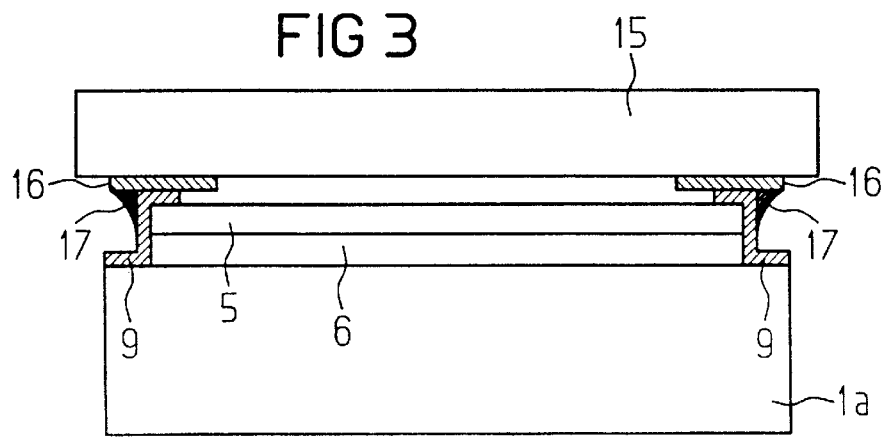

SURFACE ACOUSTIC WAVE COMPONENT

BACKGROUND OF THE INVENTION

1. Field of the Invention

The present invention is directed to an electronic component, particularly a surface acoustic wave (SAW) component, of the type having a piezoelectric substrate with electrically conductive structures arranged thereon, and having a base plate with external electrical terminal elements that are electrically connected to the conductive structures of the chip.

2. Description of the Prior Art

Electronic components of the above type usually have chips with a piezoelectric substrate and with electrically conductive structures arranged on the substrate, particularly active filter structures such as, for example, interdigital transducers, terminal tracks, what are referred to as pads, and the like. The electrical contacting of these structures to external terminal elements in turn ensues via interconnects that are applied onto a carrier plate of the chip, for example onto a ceramic or plastic plate.

During the course of the continuously increasing miniaturization of the components, i.e. given further reduction of the dimensions of SAW components down to chip dimensions smaller than 3×3 mm, the space required for the electrical contacting of the component—which cannot be reduced to the same extent—causes considerable problems, particularly when the components are protected against physical and chemical environmental influences and moisture with a protective covering. Such a protective covering can be formed by multi-layer, usually 2-layer, structured protective films—also called PROTEC by Siemens Matsushita Components GmbH & Co. KG.

SUMMARY OF THE INVENTION

An object of the present invention is to create a solution that allows further miniaturization of the SAW components without the protective effect of the protective film and the efficiency of the contact elements and of the SAW components overall being degraded.

Given an electronic component of the type initially described, this object is inventively achieved in general by the demand for minimal chip dimensions being met by displacing the electrical contact elements into the plane above the protective film.

More specifically, this object is achieved in accordance with the invention in an electronic component having a piezoelectric substrate with electrically conductive structures arranged on the substrate and having a base plate with external electrical terminal elements that are electrically connected to the conductive structures of the chip, and wherein a structured protective film is applied onto the chip surface which carries the conductive structures, the surface of the protective film facing away from the piezoelectric substrate carrying stripe-shaped electrical contact elements which are directly connected to the electrically conductive structures via solder balls known as bumps, and are also connected to the electrical terminal elements of the base plate, without any crossovers.

DESCRIPTION OF THE DRAWINGS

FIG. 1 is a side view, partly in section, of a wafer with a chip thereon constructed in accordance with the principles of the present invention.

FIG. 2 is a plan view of the chip shown in FIG. 1.

FIG. 3 is a side view, partly in section, of the chip according to FIGS. 1 and 2, together with a base plate, constructed in accordance with the principles of the present invention.

DESCRIPTION OF THE PREFERRED EMBODIMENTS

The wafer 20 of FIG. 1 is composed of a piezoelectric substrate that can be respectively separated into chips 1 along lines A—A. On the portion of the piezoelectric substrate 1a on which each chip is disposed, each chip carries electrically conductive structures 2, 3 and 4, particularly active filter structures such as, for example, interdigital transducers.

A PROTEC film, i.e. a multi-layer, structured protective film 5, 6, for example solder stop film of polyimide, epoxy or polyester in the illustrated exemplary embodiment, is applied onto the chip surface carrying the electrically conductive structures 2, 3 and 4. This film, that serves for protecting the SAW component against harmful environmental influences, for example for protection against dust (particularly conductive particles), aggressive chemical substances and moisture, covers the electrically conductive structures 2, 3 and 4 and the remaining chip surface in optimally large sub-areas.

The lack of space for providing further electrically conductive structures in the plane of the active filter structures 2, 3, particularly for their contact elements 7, 11 together with contact locations 12, caused by the miniaturization of the SAW components is inventively overcome be displacing these structures onto that surface of the protective film 5—also referred to as cover film—that faces away from the piezoelectric substrate 1a.

The film 5 alternatively can be a thin ceramic film capable of structuring that has a coefficient of thermal expansion matched to the chip, preferably to the coefficient of thermal expansion in longitudinal chip direction or, respectively, in the direction of the surface waves. A component equipped with a ceramic film in this way is already gas-tight.

The electrically conductive connection of the structures 7, 11 composed, for example, of Cu layers and their contact locations 12 to the structures 2, 3 and 4 of the chip 1 ensues via through-contacts 8 in the protective films 5, 6 whose openings are uncovered using a photo-lithographic technique or by laser or plasma erosion and a directly electrically connected via solder balls or bumps of gold pieces called bumps 10 in spaces free of protective films. Particularly this latter contacting with bumps 10, which can be produced by soldering or thermal compression, takes the extremely slight availability of space into consideration and also enables a crossing-free electrical connection between the structures 3 and 7. Additionally, the risk of deforming the chip given mechanical or thermal load is also substantially reduced by this type of contacting.

In order to enable a bond or, solder connection with the interconnect according to FIG. 1, for example Cu track or, structure 7, metal layers of, for example, Ni, Pd or Au are chemically or galvanically applied onto the Cu track—viewed in the direction to the bump 10—or a solderable layer of, for example, Su or SuPb is applied thereto.

The stripe-shaped electrical contact elements 7, 11 and their contact locations 12 are worked from a conductive Cu layer.

An electrical contacting in the region of the contact locations 12 to external electrical terminal elements (not shown in the drawing) of the base plate 15 ensues in SMT technology, namely preferably in the middle of the chip, i.e. in the regions of the symmetry axes of the chip 1. Like the aforementioned bump contacting, this contacting directed to the middle of the chip also contributes thereto that the deformation of the chip 1, as can occur due to the different coefficients of thermal expansion of the individual materials interacting with one another, is minimized.

The solder balls or bumps 10 are preferably arranged on the contact locations 12 in the fashion of a micro-ball grid area (micro-ball grid array). Additional solder balls on contact locations 12 that are not electrically connected also contribute to the increased mechanical stability and dependability of the micro-ball grid array contacted on the base plate 15 or the circuit carrier.

The structure of the SAW component according to FIG. 3 additionally creates a gas-tight connection of the chip 1 to the base carrier 15. To this end, the end faces of the protective films 5, 6—uncovered analogously to the openings for the through-contacts—are closed gas-tight with a metallization 9 in their entire circumferential region between base plate 15 and piezoelectric substrate 1a. Finally, the metallization 9 is soldered with solder 17 to a solderable layer 16 on the base plate 15 that is likewise circumferential according to the individual chips 1. If an additional RF shielding is required, then a metal cap or a metal-coated plastic cap can be inverted over the chip 1, this being electrically contacted to the metallic layer 16 of the base plate.

Although modifications and changes may be suggested by those skilled in the art, it is the intention of the inventors to embody within the patent warranted hereon all changes and modifications as reasonably and properly come within the scope of their contribution to the art.

We claim:

1. A surface acoustic wave component comprising:
    a base plate having external electrical terminal elements;
    a chip comprising a piezoelectric substrate having a substrate surface with electrically conductive structures disposed thereon;
    protective film structures being disposed on said substrate surface, said protective film structures building up a protective film cover, said protective film cover having a film surface facing away from said substrate surface;
    a plurality of electric contact elements being disposed on said film surface;
    said electrical contact elements having contact locations;
    said electrically conductive structures being electrically connected to said contact locations by means of bumps;
    said chips being arranged on said base plate with said external electrical terminal elements being electrically connected to said contact locations.

2. A surface acoustic wave component according to claim 1, wherein the electrically conductive structures are formed by a structured copper layer.

3. A surface acoustic wave component according to claim 2, wherein a structured nickel layer is disposed on said structured copper layer;
    a structured gold layer is disposed on said structured nickel layer; and
    the bumps are arranged on the gold layer.

4. A surface acoustic wave component according to claim 1, wherein said protective film cover comprises a film selected from the group consisting of polyimide film and polyester film.

5. A surface acoustic wave component according to claim 1, wherein said protective film cover is a multi-layer protective film.

6. A surface acoustic wave component according to claim 5, wherein said multi-layer protective film comprises a structured ceramic cover film.

7. A surface acoustic wave component according to claim 5, wherein the multi-layer protective film is a composite film comprising an insulation layer with a structured metal film arranged thereon.

* * * * *